(12) United States Patent
Chen

(10) Patent No.: US 7,103,492 B2
(45) Date of Patent: Sep. 5, 2006

(54) PROCESS INDEPENDENT DELAY CHAIN

(75) Inventor: Chung Kuang Chen, Pan Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/872,018

(22) Filed: Jun. 18, 2004

(65) Prior Publication Data

US 2005/0283336 A1   Dec. 22, 2005

(51) Int. Cl.
*G01R 35/00* (2006.01)
*G01D 18/00* (2006.01)

(52) U.S. Cl. .......................... 702/107; 702/79; 702/89; 327/149; 327/158

(58) Field of Classification Search .................... None
See application file for complete search history.

(56) References Cited

U.S. PATENT DOCUMENTS

| | | | |
|---|---|---|---|
| 4,255,721 A | 3/1981 | Wilson, Jr. | |
| 4,547,749 A | 10/1985 | Kuo | |
| 4,714,901 A | 12/1987 | Jain et al. | |
| 4,746,823 A | 5/1988 | Lee | |
| 4,843,265 A | 6/1989 | Jiang | |
| 4,940,910 A | 7/1990 | Jiang | |
| 5,061,908 A | 10/1991 | Pietrzyk | |
| 5,424,985 A * | 6/1995 | McClure et al. | 365/194 |
| 5,663,921 A | 9/1997 | Pascucci et al. | |
| 5,835,423 A | 11/1998 | Harima | |
| 6,072,733 A | 6/2000 | Advani | |
| 6,075,832 A * | 6/2000 | Geannopoulos et al. | 375/375 |
| 6,490,224 B1 | 12/2002 | Manning | |
| 6,560,164 B1 | 5/2003 | Kawai et al. | |
| 6,570,428 B1 | 5/2003 | Liao et al. | |
| 6,643,789 B1 | 11/2003 | Mullarkey | |
| 2002/0008556 A1 * | 1/2002 | Manning | 327/158 |
| 2004/0059533 A1 * | 3/2004 | Parrish et al. | 702/107 |

OTHER PUBLICATIONS

Yeh, C.C. et al., "Novel Operation Schemes to Improve Device Reliability in a Localized Trapping Storage SONOS-Type Flash Memory," IEDM 2003 173-176.

* cited by examiner

*Primary Examiner*—Marc S. Hoff
*Assistant Examiner*—Manuel L Barbee
(74) *Attorney, Agent, or Firm*—Kenta Suzue; Haynes Beffel & Wolfeld LLP

(57) ABSTRACT

An integrated circuit has a circuit for adjusting the time period of an output signal. The adjustment can compensate for semiconductor processing variations varying from wafer to wafer. The circuit adjusts the delay generated by an adjustable delay line, and adjusts the occurrence in time of the trailing edge of the output signal. A value which corresponds with a suitable delay to be generated by the adjustable delay line is stored in nonvolatile storage on the integrated circuit.

25 Claims, 8 Drawing Sheets

PROCESS INDEPENDENT DELAY CHAIN

BACKGROUND OF THE INVENTION

1. Field of the Invention

The present invention relates to clocked integrated circuits generally, and more particularly to integrated circuits with adjustable delay lines to support timing requirements.

2. Background

A variety of integrated circuits with different mission functions have high clock rates and as a result have precise timing requirements. For example, in some memory devices, the time between applying a read signal in one clock cycle, and sampling in another clock cycle, the data output in response to the read signal must be precisely controlled. However, producing signals with precise delays across a product line is a nontrivial problem due to semiconductor process variations that occur from one wafer to another wafer, from one integrated circuit to another integrated circuit on the same wafer, and even across different portions of the same integrated circuit.

A common approach to addressing process variations is to employ a design methodology with a "worst case" modeling approach. Such an approach consistently underestimates circuit performance, and results in expensive over-design. A needed approach is to make integrated circuits that satisfy demanding timing requirements without unnecessary and expensive over-design.

SUMMARY OF THE INVENTION

In one aspect of the invention, a method is provided for adjusting a signal generated by an integrated circuit while testing or manufacturing the integrated circuit. The method compensates for semiconductor processing conditions associated with manufacturing the integrated circuit. In response to a leading edge of a control signal, a leading edge of an output signal is generated. In response to a trailing edge of the control signal, a trailing edge of the output signal is generated after a delay of an adjustable delay line. A time period ended by the trailing edge of the output signal is measured. If the time period falls outside a range of periods, such the specified range of periods for the product, the delay of the adjustable delay line is changed. A value determining the delay generated by the adjustable delay line is stored in nonvolatile storage on the integrated circuit. The stored value corresponds to the time period falling inside the range of periods. In this manner, products can be manufactured with specified ranges of periods more narrow that can be achieved by control of manufacturing processes alone.

In one embodiment, the control signal is an address transition signal and the output signal is a clock signal for a sense amplifier. In various embodiments, when the delay of the adjustable delay line is changed, a new value is stored in nonvolatile or volatile storage on the integrated circuit, which determines the delay generated by the adjustable delay line.

In some embodiments, when the delay is changed, the delay is incremented up or down based on whether the time period is too short or too long. In some embodiments, if the time period falls outside the range of periods, the delay is changed until the time period falls inside the range of periods. Alternatively, the delay is changed until an error condition occurs. An error condition results if the needed delay is outside the range offered by the adjustable delay line. In various embodiments, the time period can be set with a precision of about 1 ns or less. The range of adjustment is wide enough to account for process variations in the manufacturing line, and in some embodiments about 4 nanoseconds wide or less.

In another aspect of the invention, an integrated circuit has an adjustable control signal. The integrated circuit has storage, cascaded load and transistor stages, and a signal generator. The storage stores a value in a range of values and is used for programming after testing the integrated circuit. The value compensates for semiconductor processing conditions associated with manufacturing of the integrated circuit. The cascaded stages are coupled to the storage, for example via a decoder. Each stage has a load and each stage corresponds to one of the values in the range of values that can be stored in the storage. At least one of the stages is a selected stage that corresponds to the value in the storage. The cascaded stages have a total load, which includes the load of the selected stage, and loads of stages prior to the selected stage. The signal generator is coupled to the cascaded stages. The signal generator generates a leading edge of an output signal and, after a delay caused by the total load of the cascaded stages, a trailing edge of the output signal.

In one embodiment, the control signal is an address transition signal and the output signal is a clock signal for a sense amplifier. The storage includes a nonvolatile memory on the integrated circuit. The storage may also include a volatile memory on the integrated circuit which, prior to storage of the final value in the nonvolatile memory, stores values after determining an adjustment of the delay of the adjustable delay line.

In some embodiments, the value of the storage is set to adjust the delay over a range of delay suitable to correct for process variations within a manufacturing run. In some embodiments, the value is set to adjust the delay over a range of delay on the order of 4 nanoseconds, or less. In some embodiments, the delay is adjustable in response to the value with a precision of about 1 nanosecond, or less. In some embodiments, the load of each stage is a resistive and capacitive load.

In another aspect of the invention, a method is provided for manufacturing integrated circuits that generate output signals in response to input signals with controlled timing. Non-volatile memory and an adjustable delay line are provided on an integrated circuit. The adjustable delay line is responsive to data stored in the non-volatile memory to set a delay time. A signal generator is provided on the integrated circuit, which produces an output signal in response to an input signal and the delay time and indicates the controlled timing. Whether the output signal provided by the signal generator on the integrated circuit falls within a specified range for the controlled timing is determined. When the timing of the output signal provided by the signal generator is not within the specified range, then a value of the data is stored in the non-volatile memory to adjust the adjustable delay line.

In some embodiments, the integrated circuit has a memory array, and the input signal is an address signal. In some embodiments, the delay time is adjustable in increments of about 1 nanosecond or less. In some embodiments, the specified range for the controlled timing has a width of about 4 nanoseconds or less.

DETAILED DESCRIPTION

Figure 1:
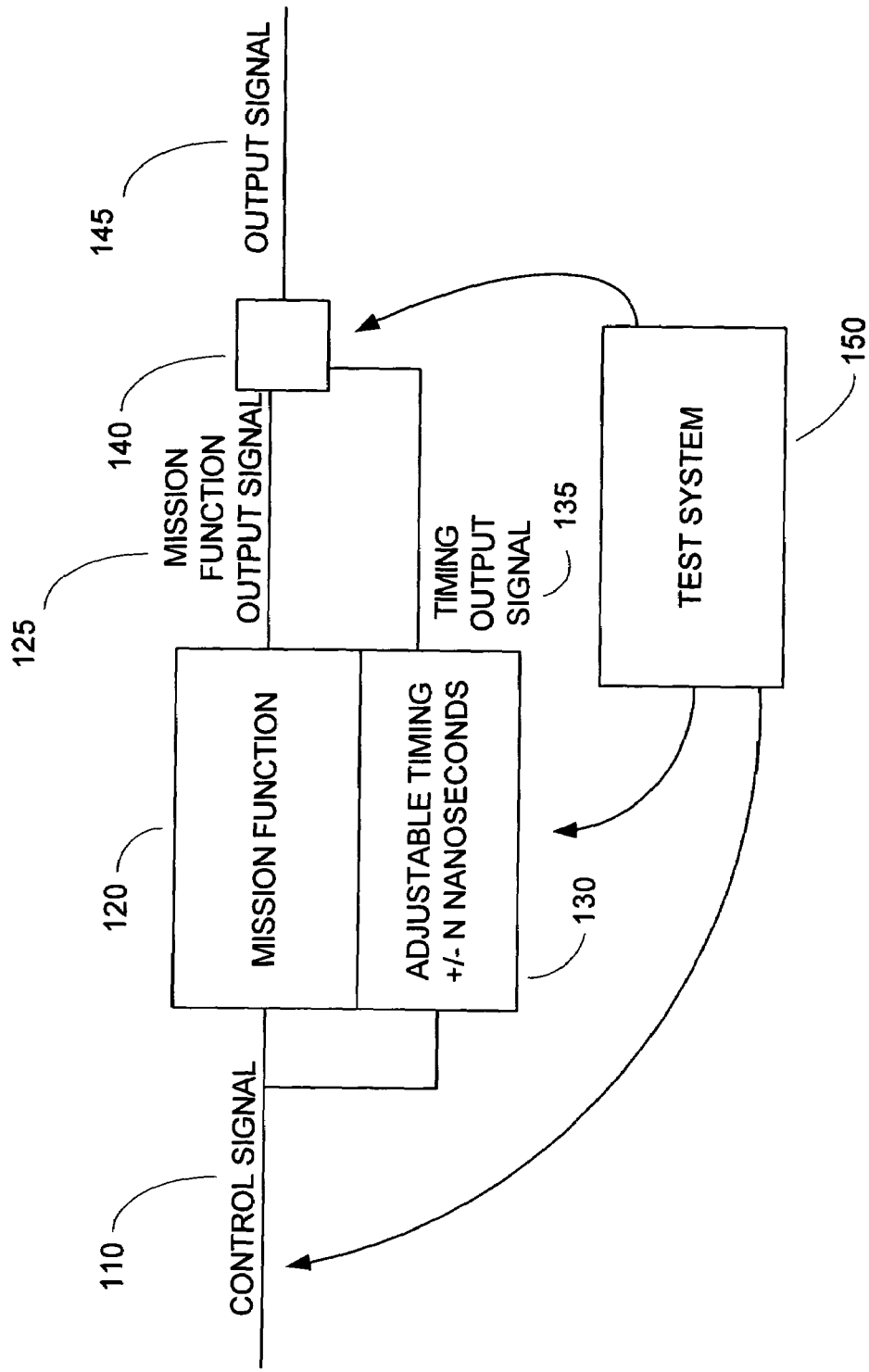
FIG. 1 is a simplified block diagram of a circuit for adjusting the timing of a signal, mission function circuitry, and a test system.

FIG. 1 is a simplified block diagram of adjusting timing circuitry 130, mission function circuitry 120, and a test system 150. The mission function circuitry 120 includes circuits which carry out the purpose of the integrated circuit as a whole or of a particular functional block of the integrated circuit. The adjustable timing circuitry 130 and the mission function circuitry 120 both receive control signal 110. After receiving control signal 110, the adjustable timing circuitry 130 generates a timing output signal 135 with a precision of n nanoseconds. Circuitry 140 treats the timing output signal as an enable signal and generates output signal 145, which is based on mission function output signal 125. Circuitry 140 may also amplify the mission function output signal 125 to generate output signal 145. Thus, the invention is useful in any integrated circuit where input and output signals of an adjustable timing circuit must obey a tightly specified delay relationship. Test system 150 performs voltage and time measurements and controls the delay adjustment process.

Figure 2:
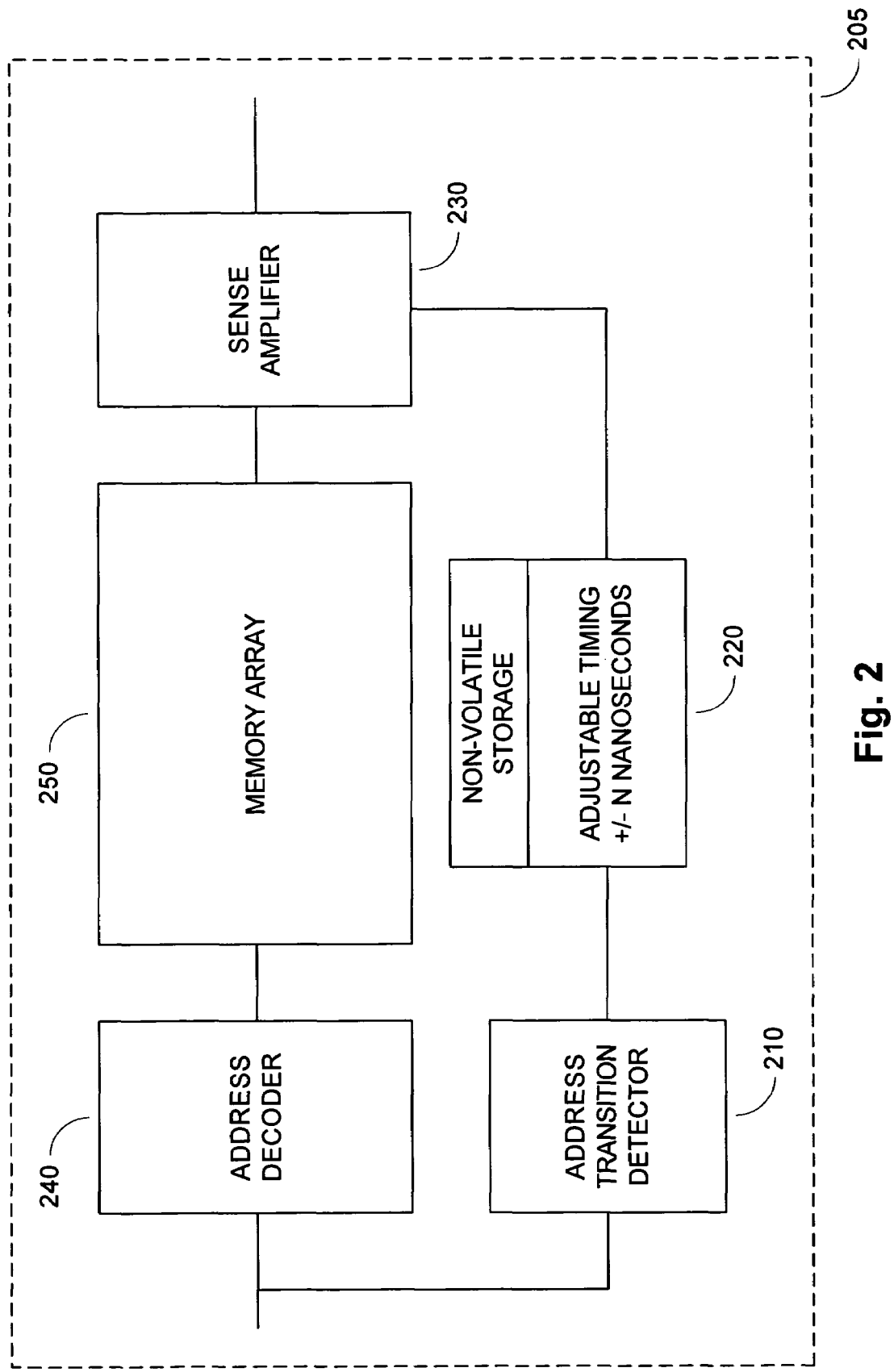
FIG. 2 is a simplified block diagram of an integrated circuit with a memory array and a circuit for adjusting the timing of a signal.

FIG. 2 is a simplified block diagram of a memory integrated circuit 205. Memory array 250 receives signals from address decoder 240 to access a particular cell or block of memory array 250. A sense amplifier 230 reads stored values from the memory array 250. The sense amplifier 230 must be clocked properly from the adjustable timing circuitry 220 so that amplification of the bit line voltages of the memory array 250 occurs with precise timing. The adjustable timing circuitry has nonvolatile storage to store a value that partly determines the timing.

Figure 3:
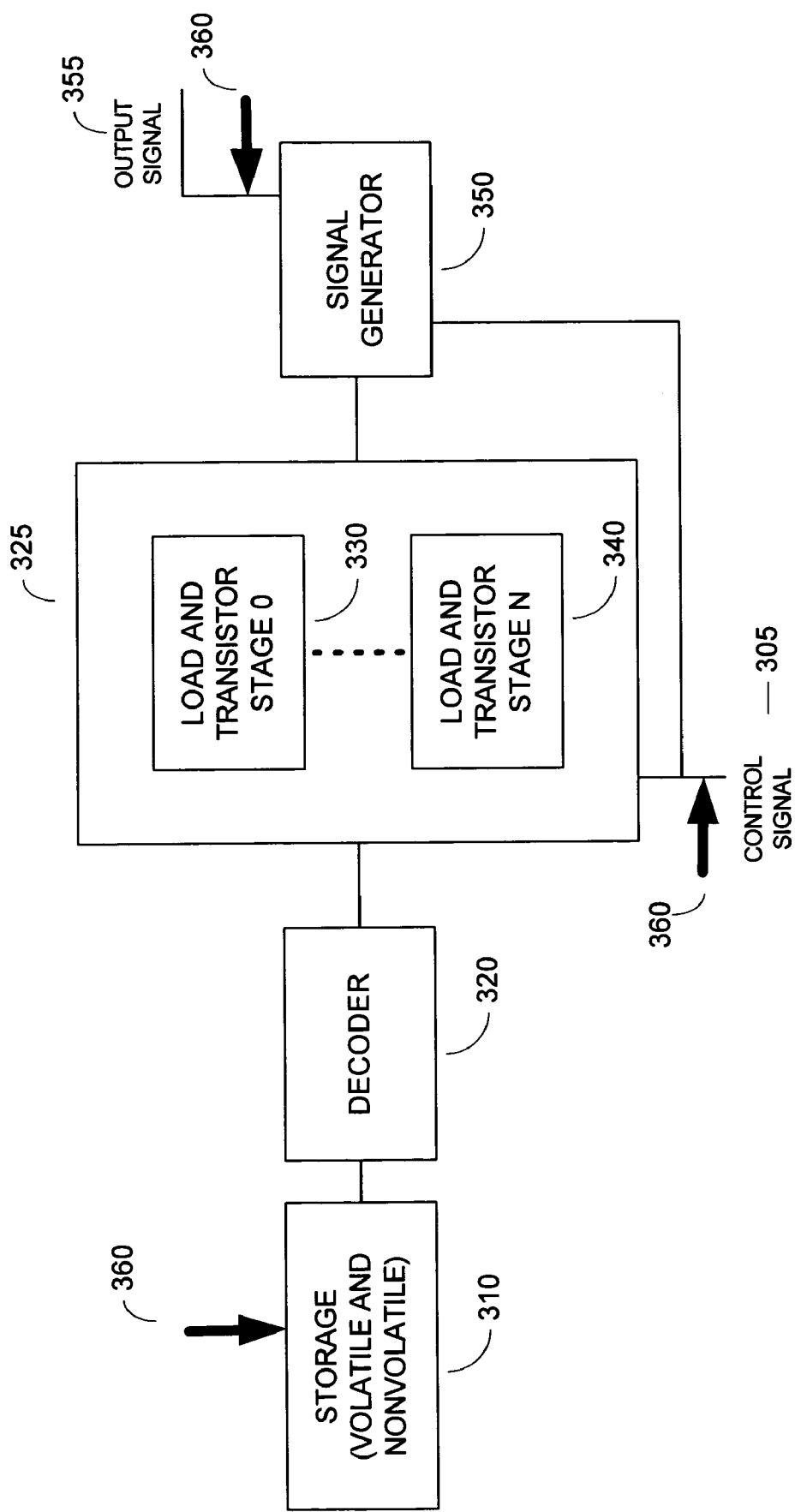
FIG. 3 is a simplified block diagram of a circuit for adjusting the timing of a signal.

FIG. 3 is a simplified block diagram of the adjustable timing circuitry. Storage 310 stores a value that determines a delay generated by the adjustable delay line 325. Decoder 320 receives the value stored in storage 310 and selects the related load and transistor stage of the adjustable delay line 325. In addition to load and transistor stage 0 330 and load and transistor stage N 340 that are shown, the adjustable delay line 325 includes any additional stages to correspond with the possible outputs of decoder 320. For example, in an embodiment with a 4-to-16 decoder 320, there are 16 load and transistor stages. More stages in the adjustable delay line 325 permit a greater range of delays to be generated by the adjustable timing circuitry. A control signal 305, typically a timing signal, is coupled to adjustable delay line 325 and signal generator 350, and initiates the delay of adjustable delay line 325. The signal generator 350 generates the output signal 355 after the delay of the adjustable delay line 325. Probes 360 carry signals, such as an output signal, to a test system, which compares the control signal 305, measures the output signal 355, and/or generates the control signal 305, and then changes the value held in the storage 310.

Figure 4A:
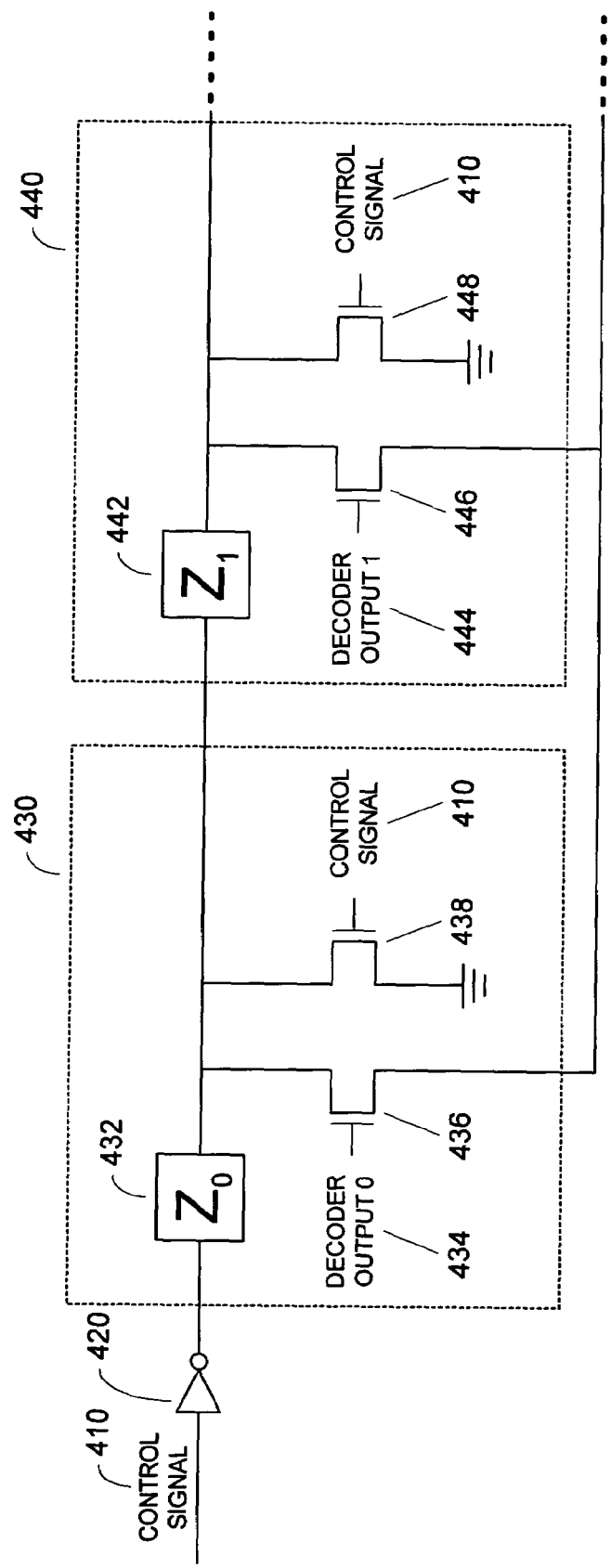
FIGS. 4A and 4B are circuit diagrams of an adjustable delay line.
Figure 4B:
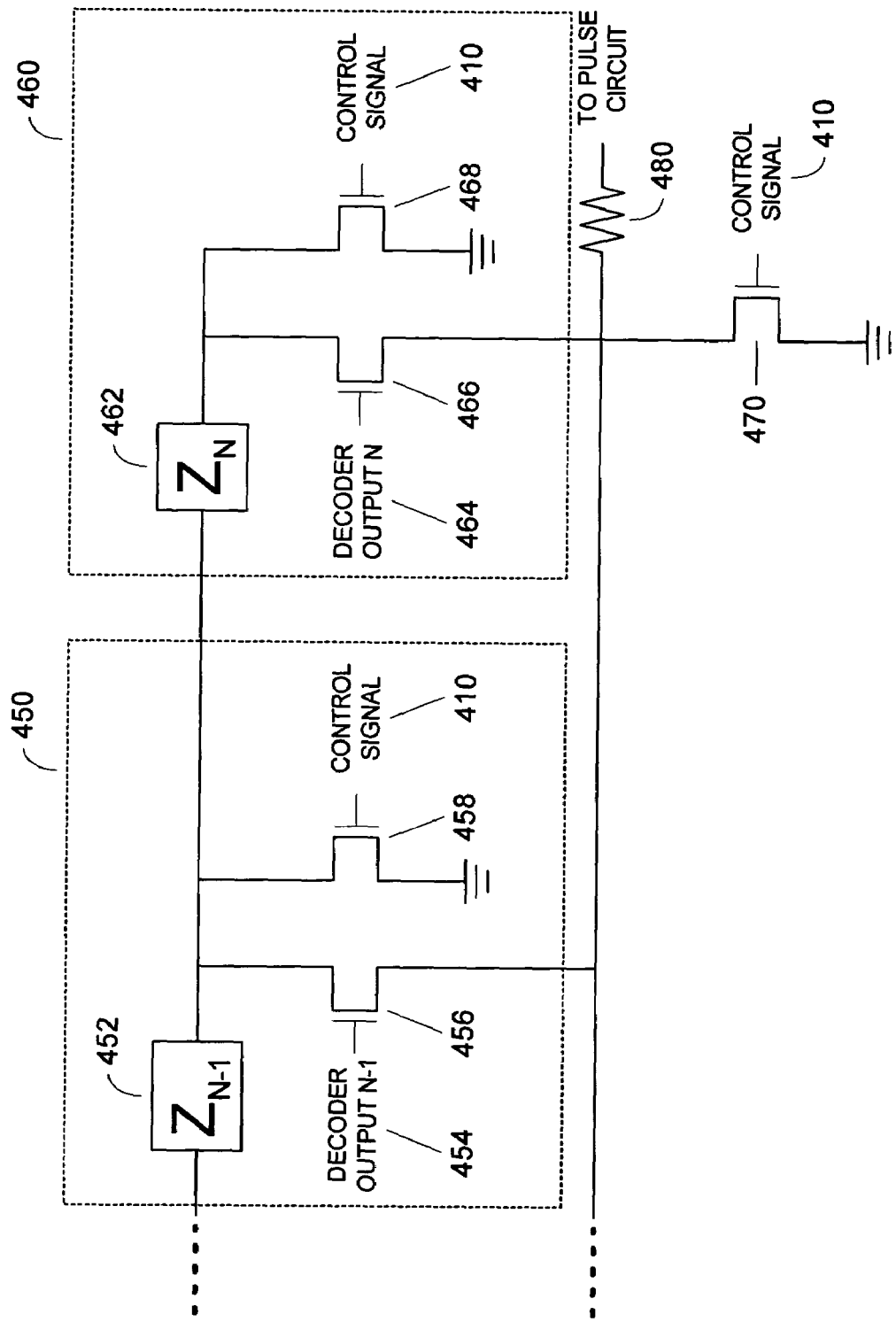

FIGS. 4A and 4B are circuit diagrams of an adjustable delay line. The adjustable delay line includes a cascaded number of load and transistor stages and an inverter 420 which receives as input control signal 410. The output of inverter 420 is coupled to load and transistor stage 0 430. Load and transistor stage 0 430 includes load $Z_0$ 432, and pass transistors 436 and 438. One terminal of load $Z_0$ 432 is coupled to the output of inverter 420, and the other terminal of load $Z_0$ 432 is coupled to load and transistor stage 1 440 and is also coupled to one of the current carrying terminals of both pass transistors 436 and 438. The other current carrying terminal of pass transistor 438 is coupled to ground. The other current carrying terminal of pass transistor 436 is coupled to resistor 480 and a current carrying terminal of transistor 470. The gate of pass transistor 436 is coupled to the decoder output 0 434. The gate of pass transistor 438 is coupled to control signal 410. Load and transistor stage 1 440 has a structure similar to load and transistor stage 0 430, and includes load Z1 442, and pass transistors 446 and 448. However, the gate of pass transistor 446 is coupled to decoder output 1 444. Not shown are a number of load and transistor stages between load and transistor stage 1 440 and load and transistor stage N-1 450. In one embodiment of the invention, there are 16 load and transistor stages, and load and transistor stage N-1 450 is load and transistor stage 14, and load and transistor stage N 460 is load and transistor stage 15. Transistor 470 has a gate coupled to control signal 410, a current carrying terminal coupled to ground, and another current carrying terminal coupled to each of the load and transistor stages. Resistor 480 is coupled to each of the load and transistor stages and to the signal generator. In some embodiments, the adjustable delay line generates a delay over a range of delay on the order of 4 nanoseconds, or less. In some embodiments, the delay is adjustable in response to the value in the storage with a precision of about 1 nanosecond, or less.

Figure 5:
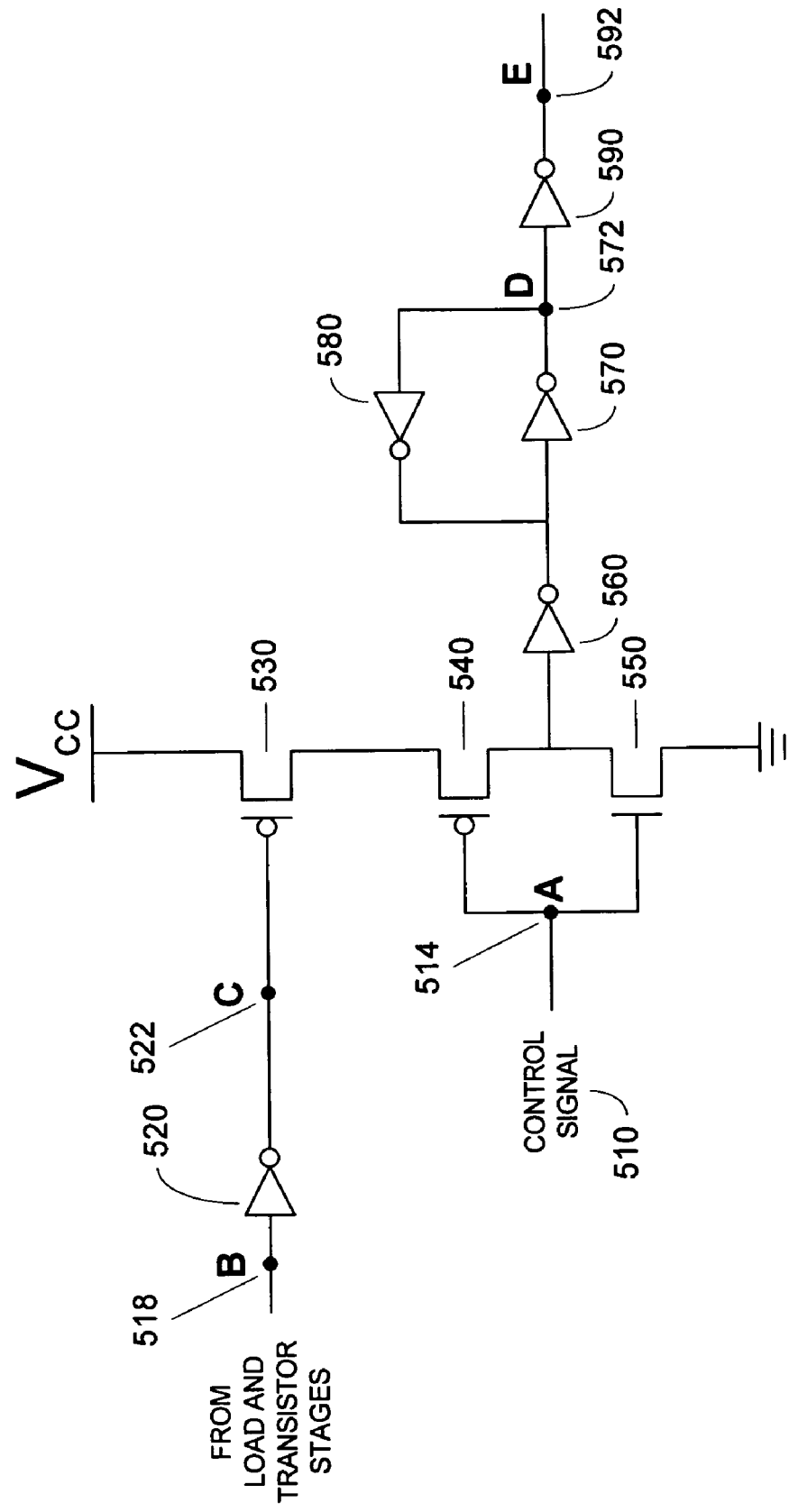
FIG. 5 is a circuit diagram of a signal generator.

FIG. 5 is a circuit diagram of a signal generator. Node B 518 receives the output of the adjustable delay line. Inverter 520 has an input coupled to node B 518 and an output coupled to node C 522. P-type transistor 530 has a gate coupled to node C 522, a current carrying terminal coupled to supply voltage $V_{CC}$, and another current carrying terminal coupled to p-type transistor 540. Node A 514 receives a control signal 510 and is connected to the gates of p-type transistor 540 and n-type transistor 550. P-type transistor 540 has a current carrying terminal coupled to p-type transistor 530. N-type transistor 550 has a current carrying terminal coupled to ground. The output of the inverter with p-type transistor 540 and n-type transistor 550 is connected to the input of inverter 560. The output of inverter 560 is connected to a latch formed by inverters 570 and 580. The output of the latch is connected to node D 572. Node D is connected to the input of inverter 590. The output of inverter 590 is connected to node E 592.

Figure 6:
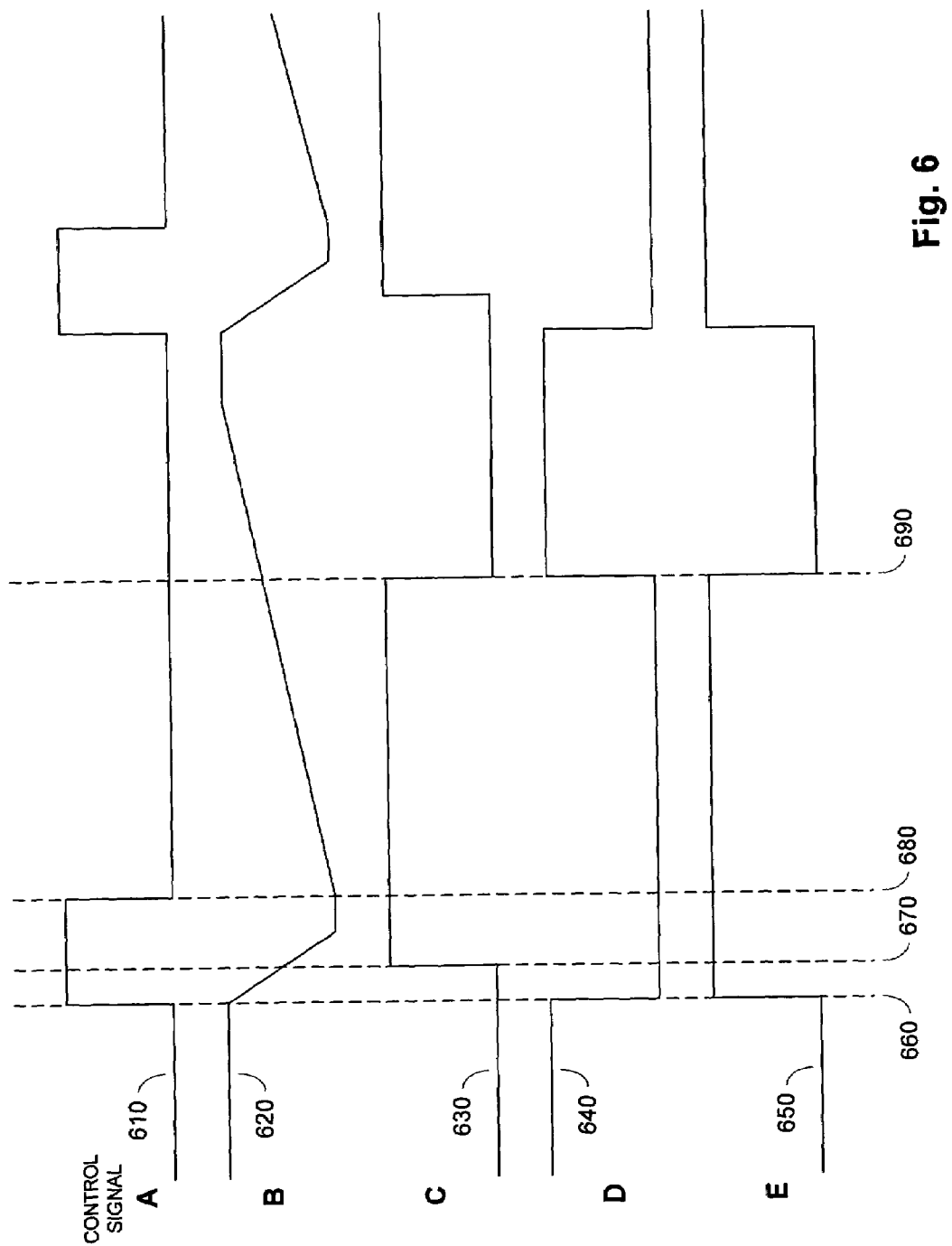
FIG. 6 is a timing diagram showing waveforms from the signal generator.

FIG. 6 is a timing diagram showing waveforms from the signal generator. An explanation of the behavior of the waveforms of FIG. 6 follows, with frequent reference to FIGS. 4A, 4B, and 5. Waveform 610, the control signal, corresponds to node A 514 of FIG. 5. Waveform 620 corresponds to node B 518 of FIG. 5. Waveform 630 corresponds to node C 522 of FIG. 5. Waveform 640 corresponds to node D 572 of FIG. 5. Waveform 650 corresponds to node E 592 of FIG. 5.

Prior to time 660, the control signal, waveform 610 at node A, is low. Waveform 640 is high after being inverted three times by transistor 540, inverter 560, and inverter 570 of FIG. 5. Waveform 650 is low after inverter 590 of FIG. 5 inverts waveform 640. Inverter 420 of FIG. 4A inverts control signal 410 and supplies a high voltage to all load and transistor stages of the adjustable delay line. The low control signal 410 keeps off pass transistors 438, 448, 458, and 468 of FIGS. 4A and 4B. At least one of the decoder outputs is high, turning on a pass transistor of one of the load and transistor stages, such as one of pass transistors 436, 446, 456, and 466 of FIGS. 4A and 4B, causing a high signal to be sent to node B 518 of the signal generator of FIG. 5. The inverter 520 of FIG. 5 inverts the high signal at node B 518 to a low signal at node C 522. The low signal at node C 522 turns on p-type transistor 530 and passes supply voltage $V_{CC}$ to p-type transistor 540.

At time 660, the leading edge of the control signal, waveform 610 at node A, is generated. After time 660, the control signal, waveform 610 at node A, remains high. Waveform 640 is low after waveform 610 is inverted three times by transistor 550, inverter 560, and inverter 570 of FIG. 5. After another inversion by inverter 590, waveform 650 is high, and the leading edge of the output signal is generated. Inverter 420 of FIG. 4A inverts the high control signal 410 and supplies a low voltage to all load and transistor stages of the adjustable delay line. The high control signal 410 turns on pass transistors 438, 448, 458, and 468 of FIGS. 4A and 4B, thereby draining the charge stored at the nodes connected to the loads 432, 442, 452, and 462. The high control signal 410 also turns on pass transistor 470, which also drains the charge stored at the nodes connected to the loads 432, 442, 452, 462, and 480. All the transistors of the adjustable delay line that drain charge cause a steep drop in waveform 620.

At time 670, waveform 620 descends past the trip point of inverter 520 of FIG. 5. Waveform 630 at node C turns high, turning off p-type transistor 530 of FIG. 5.

At time 680, the trailing edge of the control signal, waveform 610 at node A, is generated. After time 680, the control signal, waveform 610 at node A, remains low. Initially, because p-type transistor 530 of FIG. 5 is off, p-type transistor 540 is not coupled to supply voltage $V_{CC}$, and the inverter with p-type transistor 540 does not work. Thus, initially the trailing edge of the control signal, waveform 610 at node A, has no effect on waveforms 640 and 650. The low control signal 410 keeps off pass transistors 438, 448, 458, and 468 of FIGS. 4A and 4B. At least one of the decoder outputs is high, such as decoder output 0 434, decoder output 1 444, decoder output N-1 454, or decoder output N 464 of FIGS. 4A and 4B. The high decoder output turns on the corresponding pass transistor, such as pass transistor 436, pass transistor 446, pass transistor 456, or pass transistor 466 of FIGS. 4A and 4B.

The total load of the adjustable delay line depends on the load and transistor stage with the pass transistor that is on. This total load largely determines the rising slope of waveform 620. For example, if decoder output 0 434 of FIG. 4A is high, pass transistor 436 is turned on, and load and transistor stage 0 430 is selected. The total load of the adjustable delay line is minimized, and the rising slope of waveform 620 is steep. In another example, if decoder output N 464 of FIG. 4B is high, pass transistor 466 is turned on, and load and transistor stage N 460 is selected. The total load of the adjustable delay line is maximized, because the total load includes not only load $Z_N$ 462 of load and transistor stage 460 of FIG. 4B, but also the loads of all prior load and transistor stages. The maximized total load of the adjustable delay line causes the rising slope of waveform 620 to be shallow. Similarly, an intermediate decoder outputs select an intermediate load and transistor stage. Then, the total load of the adjustable delay line is an intermediate value including the load of the selected stage and any prior stages. Thus a high intermediate decoder output causes an intermediate rising slope of waveform 620.

At time 690, when rising waveform 620 exceeds the trip point of inverter 520 of FIG. 5, then waveform 630 at node C drops low, turning on p-type transistor 530. Supply voltage $V_{CC}$ is then coupled to the inverter formed by p-type transistor 540 and n-type transistor 550. Waveform 640 switches high after inverting waveform 610 three times by the inverter formed by transistors 540 and 550, inverter 560, and inverter 570 of FIG. 5. Waveform 650 at node E switches low after waveform 640 is inverted by inverter 590 of FIG. 5. Thus, the output signal, waveform 650 at node E, generates a trailing edge after the delay generated by the adjustable delay line.

Figure 7:
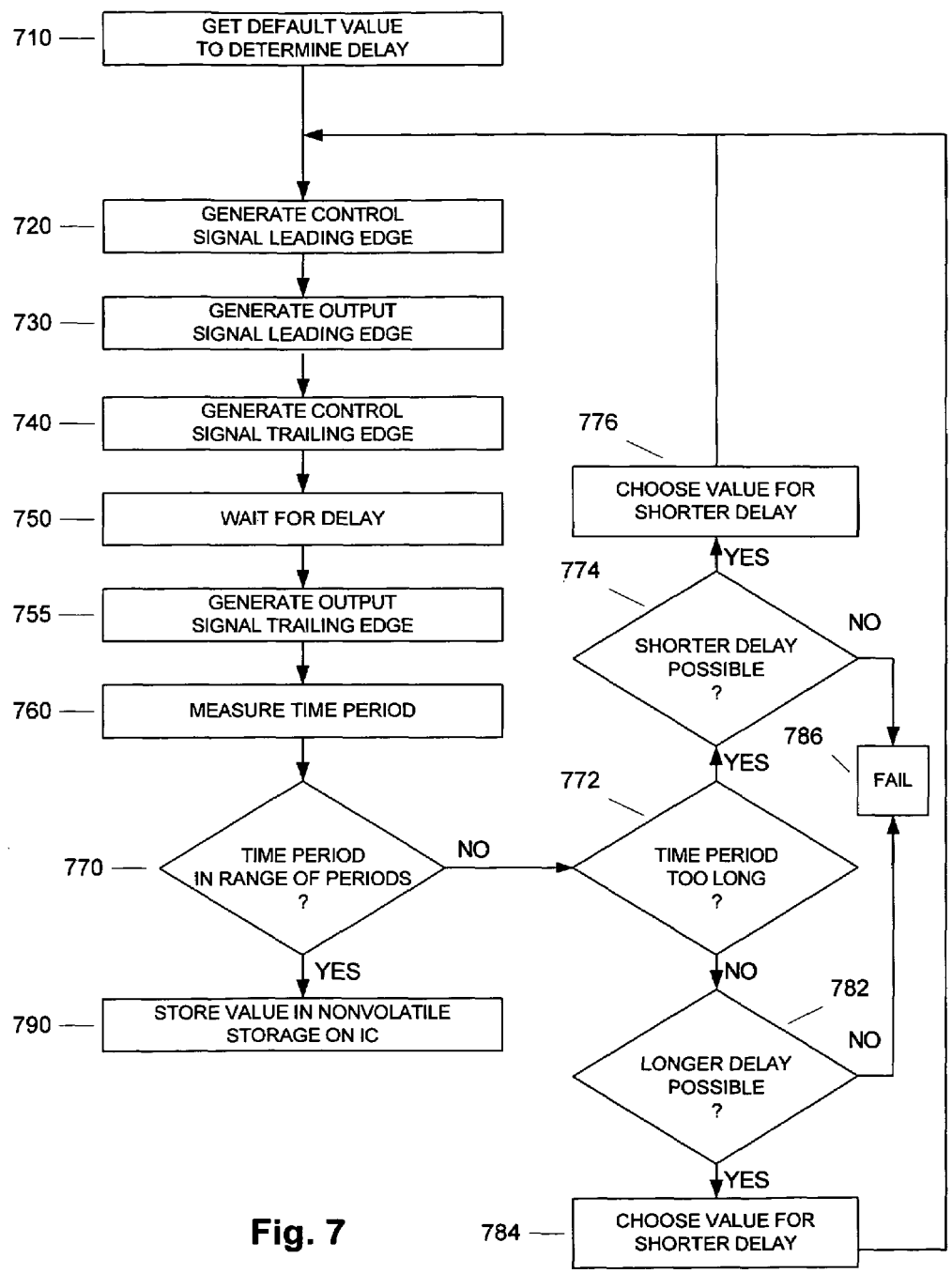
FIG. 7 is a representative process for adjusting the timing of a signal.

FIG. 7 is a representative process for adjusting the timing of a signal. At 710, a default value is acquired that determines a delay generated by the adjustable delay line. In various embodiments, the default value is retrieved from storage on the integrated circuit, or supplied by an external test system. A delay corresponding to the value is selected. For example, a decoder decodes the value and selects a load and transistor stage of the adjustable delay line. The adjustable delay line has a total load including the load of the selected load and transistor stage and any prior load and transistor stages. At 720, the leading edge of the control signal is generated. In response, at 730 the leading edge of the output signal is generated, such as by the signal generator. At 740, the trailing edge of the control signal is generated. At 750, the trailing edge of the control signal is generated. The leading and trailing edges of the control signal from 720 and 740 form a pulse, such as from a clock signal. At 750, a delay occurs, determined by the adjustable delay line. Following the delay, at 755, the trailing edge of the output signal is generated, such as by the signal generator. At 760, a time period associated with the output signal is measured, such as by the external test system. Various embodiments measure the time period between the trailing edge of the output signal and another signal edge, such as the leading edge of the output signal, the leading edge of the control signal, the trailing edge of the control signal, or some other edge. At 770, if the measured time period is in the wanted range of periods, then the delay generated by the adjustable delay line is sufficiently precise, and the value which was decoded to select the proper delay is stored in nonvolatile storage on the integrated circuit. Otherwise, at 770, if the measured time period is outside the range of periods, then the delay generated by the adjustable delay line must be adjusted. At 772, a determination is made whether the measured time period is too long. If the time period is too long, at 774, it is determined if a shorter delay is possible. A shorter delay may not be possible, such as if the adjustable delay line has already generated the minimum delay associated with selecting load and transistor stage 0. If a short delay is possible, then at 776 a value is chosen for a shorter delay and the process returns to 720. At 772, if the time period is not too long, at 782, it is determined if a longer delay is possible. A longer delay may not be possible, such as if the adjustable delay line has already generated the maximum delay associated with selecting load and transistor stage N. If a longer delay is possible, then at 784 a value is chosen for a longer delay and the process returns to 720. In some embodiments, each time the process returns to 720, the new value is stored in nonvolatile or volatile storage on the integrated circuit. The process ends in failure 786 if at 774 a shorter delay is not possible or if at 782 a longer delay is not possible.

The order of steps shown in FIG. 7 is illustrative only. The steps can be rearranged and/or changed, and steps can be added and/or removed. For example, in one embodiment, the value is stored in nonvolatile storage prior to the generation of the trailing edge of the output signal, such as prior to selecting the delay corresponding to the value. In this embodiment, because the value has already been stored in nonvolatile storage prior to measuring the time period, it is unnecessary to store the value in nonvolatile storage after measuring the time period.

While the present invention is disclosed by reference to the embodiments and examples detailed above, it is to be understood that modifications and combinations will readily occur to those skilled in the art, which modifications and combinations will be within the spirit and scope of the following claims.

The invention claimed is:

1. A method for adjusting a signal generated by an integrated circuit while testing or manufacturing the integrated circuit, comprising:
   in response to a leading edge of a control signal, generating a leading edge of an output signal;
   in response to a trailing edge of the control signal, generating a trailing edge of the output signal after a delay generated by an adjustable delay line;
   measuring a time period ended by the trailing edge of the output signal; and
   if the time period fails outside a range of periods, changing the delay generated by the adjustable delay line until the time period falls within the range of periods or until an error condition occurs; and
   storing a value in nonvolatile storage on the integrated circuit, wherein the value determines the delay generated by the adjustable delay line corresponding to the time period falling inside the range of periods.

2. The method of claim 1, wherein the control signal is a pulse signal and the output signal is a clock signal.

3. The method of claim 1, wherein said changing the delay includes storing a new value in nonvolatile storage on the integrated circuit, the new value determining the delay generated by the adjustable delay line.

4. The method of claim 1, wherein said changing the delay includes storing a new value in volatile storage on the integrated circuit, the new value determining the delay generated by the adjustable delay line.

5. The method of claim 1, wherein said changing the delay includes incrementing the delay up or down based on whether the time period is too short or too long.

6. The method of claim 1, wherein if the time period falls outside the range of periods, said changing the delay continues until the time period falls inside the range of periods.

7. The method of claim 1, wherein the error condition is an inability of the adjustable delay line to generate the delay such that the time period falls within the range of periods.

8. The method of claim 1, wherein said changing includes changing the time period with a precision of about 1 nanosecond.

9. The method of claim 1, wherein the range of periods has a width of about 4 nanoseconds or less.

10. The method of claim 1, wherein said method compensates for semiconductor processing conditions associated with manufacturing of the integrated circuit.

11. An integrated circuit having an adjustable control pulse signal, comprising:
   a storage storing a value in a range of values adapted for programming during manufacturing or testing;
   a cascaded plurality of stages coupled to the storage, each stage corresponding to one of the values in the range of values and each stage having a load,
   wherein at least one of the plurality of stages is a selected stage, the selected stage corresponding to the value in the storage, and
   wherein the cascaded plurality of stages has a total load including the load of the selected stage and loads of stages of the cascaded plurality of stages prior to the selected stage; and
   a signal generator coupled to the cascaded plurality of stages, the signal generator generating a leading edge of an output signal and, after a delay caused by the total load of the cascaded plurality of stages, a trailing edge of the output signal,
   wherein the output signal is a clock signal for a sense amplifier.

12. The integrated circuit of claim 11, wherein the integrated circuit comprises a memory array.

13. The integrated circuit of claim 11, wherein the storage includes a nonvolatile memory on the integrated circuit.

14. The integrated circuit of claim 11, wherein the storage includes a volatile memory on the integrated circuit.

15. The integrated circuit of claim 11, wherein the value is set to adjust the delay over a range of delay suitable to correct for process variations within a manufacturing run.

16. The integrated circuit of claim 11, wherein value is set to adjust the delay over a range of delay on the order of 4 nanoseconds, or less.

17. The integrated circuit of claim 11, wherein the delay is adjustable in response to the value with a precision of about 1 nanosecond, or less.

18. The integrated circuit of claim 11, wherein the load of each stage includes a resistive and capacitive load.

19. The integrated circuit of claim 11, wherein said value compensates for semiconductor processing conditions associated with manufacturing of the integrated circuit.

20. The integrated circuit of claim 11, further comprising:
   a memory array coupled to the signal generator.

21. A method for manufacturing integrated circuit, wherein the integrated circuits generate output signals in response to input signals with controlled timing, the method comprising:
   providing non-volatile memory and an adjustable delay line on an integrated circuit, the integrated circuit comprising a memory array, the adjustable delay line being responsive to data stored in the non-volatile memory to set a delay time;
   providing a signal generator on the integrated circuit, the signal generator producing an output signal in response to an input address signal and the delay time and indicating said controlled timing;
   determining whether the output signal provided by the signal generator on the integrated circuit falls within a specified range for the controlled timing; and
   when the timing of the output signal provided by the signal generator is not within the specified range, then storing a value of said data in the non-volatile memory to adjust the adjustable delay line.

22. The method of claim 21, wherein the output signal is a clock signal for a sense amplifier.

23. The method of claim 21, wherein the delay time is adjustable in increments of about 1 nanosecond or less.

24. The method of claim 21, wherein the specified range for the controlled timing has a width of about 4 nanoseconds or less.

25. The method of claim 21, further comprising:
   providing volatile memory on the integrated circuit, the adjustable delay line being responsive to data stored in the volatile memory to set the delay time.

* * * * *